United States Patent
Grodzki (10) Patent No.: US 10,338,167 B2
(45) Date of Patent: Jul. 2, 2019

(54) METHOD AND MAGNETIC RESONANCE IMAGING APPARATUS FOR DETERMINATION OF A SCAN PROTOCOL

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 173 days.

(21) Appl. No.: 15/433,159

(22) Filed: Feb. 15, 2017

(65) Prior Publication Data
US 2017/0234944 A1 Aug. 17, 2017

(30) Foreign Application Priority Data
Feb. 15, 2016 (DE) .................. 10 2016 202 240

(51) Int. Cl.
*G01R 33/28* (2006.01)
*G01R 33/54* (2006.01)
*G01R 33/385* (2006.01)

(52) U.S. Cl.
CPC ......... *G01R 33/288* (2013.01); *G01R 33/543* (2013.01); *G01R 33/385* (2013.01)

(58) Field of Classification Search
CPC .................. G01R 33/288; G01R 33/543
See application file for complete search history.

(56) References Cited

U.S. PATENT DOCUMENTS

| | | | | |
|---|---|---|---|---|
| 4,823,085 A * | 4/1989 | Fuderer | .............. | G01R 33/565 324/309 |
| 4,876,507 A * | 10/1989 | Van Vaals | .......... | G01R 33/4625 324/307 |
| 4,924,183 A * | 5/1990 | Kunz | .................. | G01R 33/482 324/309 |
| 4,987,369 A * | 1/1991 | Van Stapele | ....... | G01R 33/4833 324/307 |
| 5,196,795 A * | 3/1993 | Bodenhausen | ...... | G01R 33/446 324/309 |
| 5,283,525 A * | 2/1994 | Lamerichs | ......... | G01R 33/4833 324/307 |
| 5,361,763 A * | 11/1994 | Kao | ....................... | G01R 33/56 382/145 |
| 5,512,825 A | 4/1996 | Atalar et al. | | |
| 6,249,120 B1 * | 6/2001 | McKinnon | ............. | G01R 33/54 324/312 |
| 6,268,726 B1 * | 7/2001 | Prammer | ............. | G01N 24/081 324/300 |
| 6,288,540 B1 * | 9/2001 | Chen | ................ | G01R 33/56341 324/300 |

(Continued)

Primary Examiner — Dixomara Vargas
(74) Attorney, Agent, or Firm — Schiff Hardin LLP (57) ABSTRACT

In a magnetic resonance apparatus, a check is performed as to whether coordinate-transformed first values of system parameters of a scan protocol for a magnetic resonance scan sequence each comply with a corresponding limit value. The check is used as the basis for the adaptation of first values of scan parameters of the scan protocol in order to obtain second values of the scan parameters. The second values of the scan parameters are used as the basis for the adaptation of the coordinate-transformed first values of the system parameters in order to obtain second values of the system parameters.

22 Claims, 6 Drawing Sheets

(56) References Cited

U.S. PATENT DOCUMENTS

| | | | | |
|---|---|---|---|---|
| 6,362,619 B2* | 3/2002 | Prammer | G01N 24/081 | 324/300 |
| 6,583,621 B2* | 6/2003 | Prammer | G01N 24/081 | 324/300 |
| 6,788,055 B2* | 9/2004 | McKinnon | G01R 33/54 | 324/309 |
| 6,825,659 B2* | 11/2004 | Prammer | G01V 3/32 | 324/300 |
| 6,841,997 B2* | 1/2005 | Feiweier | G01R 33/4828 | 324/307 |
| 6,904,305 B2* | 6/2005 | Tsekos | A61B 5/0555 | 600/417 |
| 6,992,484 B2* | 1/2006 | Frank | G01R 33/56341 | 324/307 |
| 7,064,546 B2* | 6/2006 | Feiweier | G01R 33/583 | 324/307 |
| 7,088,099 B2* | 8/2006 | Doddrell | A61B 5/7257 | 324/307 |
| 7,233,818 B1* | 6/2007 | Aletras | G01R 33/56308 | 324/307 |
| 7,375,520 B2* | 5/2008 | Nezafat | G01R 33/5635 | 324/307 |
| 7,706,857 B2* | 4/2010 | Aletras | G01R 33/56308 | 324/306 |
| 7,835,780 B1* | 11/2010 | Duerk | G01R 33/287 | 600/410 |
| 7,835,783 B1* | 11/2010 | Aletras | G01R 33/56333 | 324/307 |
| 8,004,279 B2* | 8/2011 | Kruspe | G01V 3/32 | 324/303 |
| 8,598,871 B2* | 12/2013 | Bahn | G01R 33/4625 | 324/307 |
| 9,563,949 B2* | 2/2017 | Hwang | G06T 7/0016 | |
| 9,581,670 B2* | 2/2017 | Stemmer | G01R 33/56554 | |
| 9,720,128 B2* | 8/2017 | Kadayam Viswanathan | G01V 3/32 | |
| 9,886,757 B2* | 2/2018 | Chang | G06K 9/6202 | |
| 9,977,764 B2* | 5/2018 | Simola | A61B 5/04008 | |
| 10,012,709 B2* | 7/2018 | Andronesi | G01R 33/36 | |
| 10,074,174 B2* | 9/2018 | Endo | A61B 5/0037 | |
| 2005/0077895 A1 | 4/2005 | Hargreaves et al. | | |
| 2005/0212179 A1 | 9/2005 | Honda et al. | | |
| 2014/0232396 A1 | 8/2014 | Grodzki et al. | | |
| 2017/0205483 A1 | 7/2017 | Feiweier et al. | | |

* cited by examiner

METHOD AND MAGNETIC RESONANCE IMAGING APPARATUS FOR DETERMINATION OF A SCAN PROTOCOL

BACKGROUND OF THE INVENTION

Field of the Invention

The invention concerns a method for the adaptation of values of scan parameters and system parameters in a scan protocol for a magnetic resonance scan sequence on the basis of a limit value. The invention also concerns a magnetic resonance apparatus that is operable to implement such a method, as well as a non-transitory, computer-readable data storage medium encoded with programming instructions for implementing such a method.

Description of the Prior Art

Magnetic resonance (MR) imaging is a technology for generating MR images depicting an object under examination. MR imaging can achieve a high soft-tissue contrast. The object under examination, for example a patient, is typically positioned in a basic magnetic field that is static and as homogeneous as possible, with a field strength of between 0.5 tesla and 5 tesla, for example. The basic magnetic field aligns the magnetization of the nuclear spins of the object under examination; in particular, a polarization of the nuclear spin magnetization takes place along the direction of the basic magnetic field.

During an MR scan sequence, radio-frequency (RF) pulses are radiated in order to deflect the nuclear magnetization out of its rest position along the direction of the basic magnetic field, i.e. in order to excite the nuclear magnetization. The subsequent relaxation of the nuclear magnetization generates RF signals, so-called echoes. During gradient-echo MR imaging or echo-planar MR imaging (EPI), gradient echoes are generated selectively by using gradient pulses to rephase and dephase the nuclear magnetization. Refocusing RF pulses are used in spin-echo MR imaging.

Gradient pulses can be used for the spatial encoding of the MR data during the MR scan sequence. The gradient pulses generate gradient magnetic fields (gradient fields), which are superimposed on the basic magnetic field.

The MR data can be scanned (acquired) during a read-out phase of the MR scan sequence. The acquired MR data are also called raw data. The raw MR data are processed in order to reconstruct the MR image, composed of image data, of the object under examination. For example, the scanned MR data are typically digitized and are initially stored in a memory organized in the spatial-frequency space (k-space). It is then possible to use a Fourier transformation to transform the MR data into the image space in order to generate the MR image data.

The different parameters in an MR scan sequence are typically combined in a scan protocol. The scan protocol can be used in order to perform a specific MR scan sequence again later, for example with a new patient.

The scan protocol contains scan parameters and system parameters. The scan parameters determine properties of the MR scan sequence. The system parameters determine the underlying operation of hardware components of the MR system. At least the system parameters are defined in the scan protocol typically with reference to a reference coordinate system. Depending on the patient to be examined, it may then be necessary to transform at least some values of the system parameters from the reference coordinate system, for example a machine coordinate system of the MR system, into a patient coordinate system.

The scan protocol with the scan parameters and the system parameters is often determined within the context of scan planning. During scan planning, it is possible to determine values for the scan parameters and the system parameters by means of correlated planning. Scan planning can typically take a certain amount of time and/or require qualified operators. Therefore, techniques are known with which scan planning is performed in a planning phase, for example without any specific reference to the patient to be examined. The scan protocol obtained in this way can then be included in a scan phase for different patients and adapted as appropriate. In such case, then no replanning of the scan protocol is necessary during the scan phase. Typically, only the values of the system parameters are adapted to the specific patient coordinate system.

In the case of a coordinate transformation of this kind, the values of at least the system parameters can be significantly changed. As a result, technical and/or physiological limit values may be exceeded.

In order to avoid limit values being exceeded as a result of the adaptation of a scan protocol to the specific patient coordinate system, according to reference implementations the corresponding parameters of the MR scan sequence are frequently defined conservatively in the scan protocol, i.e. with a certain safety margin with respect to the corresponding limit values. For example, the amplitudes of gradient pulses in the scan protocol are frequently selected as no higher than $1/\sqrt{3}*G\_Max$, wherein $G\_Max$ designates a technological limit value of the maximum amplitude of the gradient pulses. In this case, a coordinate transformation into the patient coordinate system has sufficient headroom in order to enable a change in the values of the corresponding parameters within the prespecified limit values.

However, a technique of this kind has certain drawbacks. Typically, a technique of this kind requires the different hardware components of the MR system to be designed with respect to high limit values, wherein, due to the above-mentioned safety margin, the technical capacity of the hardware components is not always fully utilized in normal operation. In certain circumstances, this can increase the cost of the production of the MR system, although, for some applications, the increased technical capacity of the hardware components is not directly reflected in improved image quality.

SUMMARY OF THE INVENTION

An object of the invention is to provide improved techniques for the adaptation of a scan protocol for an MR scan sequence, in particular techniques enabling limit values for system parameters to be utilized as efficiently as possible.

The method according to the invention includes receiving, in a computer, a scan protocol for an MR scan sequence. The scan protocol contains first values of scan parameters and first values of system parameters. The first values of the system parameters are defined in a first coordinate system. The method further includes the determination in the computer of coordinate-transformed first values of the system parameters. The coordinate-transformed first values of the system parameters are defined in a second coordinate system. The second coordinate system is rotated in the computer relative to the first coordinate system. The method further includes checking in the computer as to whether the coordinate-transformed first values of the system parameters each comply with a corresponding limit value. The method further includes, on the basis of the check, the adaptation in the computer of the first values of the scan parameters in order to obtain second values of the scan parameters. The method further includes, on the basis of the second values of the scan parameters, the adaptation in the computer of the coordinate-transformed first values of the system parameters in order to obtain second values of the system parameters. The method further includes release of the scan protocol, with the second values of the scan parameters and with the second values of the system parameters, from the computer in a format in order to carry out the MR scan sequence by a scanner.

The techniques described herein can be used for a wide variety of MR scan sequences. Examples of MR scan sequences include: spin echo, turbo spin echo (TSE), EPI, diffusion-weighted imaging DWI), functional magnetic resonance imaging (fMRI), spectrally resolved imaging such as water-fat separation or Dixon-type techniques (chemical shift imaging).

The first coordinate system can correspond, for example, to a scanner coordinate system. The scanner coordinate system can be defined by the geometric arrangement of different hardware components of a corresponding MR data acquisition scanner. The scanner coordinate system can be defined, for example, by the geometric arrangement of gradient coils of a gradient system of the MR system and/or by the orientation of the basic magnetic field. However, in other examples, it can also be possible for the first coordinate system to be rotated relative to the scanner coordinate system.

The second coordinate system can correspond, for example, to a patient coordinate system. The patient coordinate system can be defined by the anatomy of a patient or by the position of the patient in the MR system. For example, the patient coordinate system can be aligned along specific anatomical axes of the patient. It is typically possible for the scanner coordinate system to be rotated relative to the patient coordinate system. This means that it is possible in different cases for the generation of a gradient field oriented along an axis of the patient coordinate system to require the superimposition of gradient pulses along different axes of the scanner coordinate system.

The determination of coordinate-transformed first values of the system parameters to be implemented by a coordinate rotation, for example.

In various examples, it is possible for the scan parameters to be invariant relative to the rotation of the coordinate system. This means that the scan parameters are not dependent, or not significantly dependent, on the choice of coordinate system. However, in other examples, it is also possible for at least one of the scan parameters to be dependent on the choice of coordinate system. In such an example, the method can further include the determination of coordinate-transformed first values of the scan parameters, with the coordinate-transformed first values of the scan parameters being defined in the second coordinate system.

For example, the limit values can be technical limit values and/or physiological limit values. For example, the technical limit values can be defined by the operating capacity of respective hardware components of the MR system. For example, the technical limit values can be defined by the capacity of a gradient and cooling system, by radio-frequency coils, and/or a radio-frequency-transmitting unit, etc. The physiological limit values can ensure the protection of the patient. For example, the physiological limit values can relate to radio-frequency loading per time unit (specific absorption rate, SAR) or maximum noise development.

For example, at least one corresponding limit value can be defined for each system parameter. Different limit values may be relevant for more than one system parameter. In some examples, it is also possible for more than one limit value to be defined for each system parameter, for example with respect to valid ranges, etc.

The checking as to whether the coordinate-transformed first values of the system parameters each comply with a corresponding limit value can be implemented by, for example, for each system parameter, performing a threshold value comparison between the corresponding coordinate-transformed first value and the corresponding limit value.

For example, the adaptation of the first values of the scan parameters can be implemented in order to obtain second values of the scan parameters optionally be performed if the check reveals that at least one or more system parameters do not comply with the corresponding limit values. For example, the adaptation of the first values of the scan parameters can be dispensed with if all system parameters comply with the corresponding limit values.

The adaptation of the first values of the scan parameters in order to obtain the second values of the scan parameters enables improved second values of the system parameters to be obtained with respect to the limit values. For example, specific limits for the choice of the second values of the system parameters by the second values of the scan parameters can be dispensed with or postponed. This can enable the parameter space for the choice of the second values of the system parameters to be enlarged. This enables the second values of the system parameters to be determined by adaptation of the first values of the system parameters such that these each comply with the corresponding limit value.

In this context, the adaptation of the first values of the scan parameters can be performed selectively for the first values of the scan parameters; i.e. the adaptation of further values of other parameters of the scan protocol can be dispensed with. Correspondingly, it is possible for the adaptation of the coordinate-transformed first values of the system parameters to be performed selectively for the first values of the system parameters.

Techniques of this kind can have the result that complete replanning of the scan protocol is not necessary. Instead, local rectification of the first values of the scan parameters and the coordinate-transformed first values of the system parameters can enable the scan protocol to be fundamentally retained.

The method can further include checking as to whether the second values of the system parameters each comply with the corresponding limit value. Then it is possible for the scan protocol to be optionally released if the check reveals that the second values of the system parameters each comply with the corresponding limit value. Otherwise, the correlated replanning of the values of all the parameters of the scan protocol, such as resolution, slice number and slice thickness, echo time and repetition time, etc., can be performed for the second coordinate system. Alternatively or additionally, it would otherwise also be possible for a warning to be emitted as an output to a user and/or the user to be prompted to adapt different first values of the system parameters manually.

The release of the scan protocol with the second values of the scan parameters and with the second values of the system parameters in order to carry out the MR scan sequence means that it is then possible to start the performance of the MR scan sequence with the second adapted in this way. For example, the method can further comprise the performance of the MR scan sequence with the second values of the scan parameters and with the second values of the system parameters.

The performance of the MR scan sequence enables an MR image to be obtained depicting specific physiological information with respect to the patient. Depending upon the MR scan sequence used, it is possible for different types of physiological information to be depicted within the MR image (contrast).

The techniques described herein can be used to achieve different effects. For example, the MR scan sequence can be performed with system parameters which utilize the corresponding limit values particularly effectively. Thus, a particularly high-quality MR image can be achieved. It is possible to select a time for carrying out the MR scan sequence (scan duration) to be relatively short. A short scan duration can enable motion artifacts to be reduced. It can also be possible to select further scan parameters of the MR scan sequence advantageously, such as a particularly short echo time, a short repetition time, etc. It is also be possible to design the hardware components of the corresponding MR system relatively conservatively. There may be no need to design the hardware components of the MR system with respect to relatively high limit values. This is because the headroom required between the system parameters used and the limit values can be reduced by the techniques described herein.

In various examples, it is possible for the values of the scan parameters and the values of the system parameters to be mutually limiting. For example, it can be possible by means of a different choice of the values of the scan parameters to enlarge or reduce the accessible parameter range for the values of the system parameters. Correspondingly, it is also possible by a different choice of the values of the system parameters to enlarge or reduce the accessible parameter range for the values of the scan parameters. In this context, it is in principle possible for one or more of the scan parameters to limit one or more of the system parameters, and vice versa.

For example, it would be possible for the system parameters to define properties of gradient pulses or of radio-frequency pulses of the MR scan sequence. For example, the system parameters can be selected from the following group: slew rate of gradient pulses; amplitude of gradient pulses; and transmit power of radio-frequency pulses. For example, different system parameters can designate the amplitude of different gradient pulses applied along different axes.

In various examples, the scan parameters can define a time sequence for the scan sequence. For example, the scan parameters can define the time sequence of radio-frequency pulses and/or gradient pulses of the scan sequence. For example, the scan parameters can be selected from the following group: echo time; repetition time; use of an asymmetric echo; echo spacing; read-out bandwidth.

In various examples, the system parameters can determine the operation of hardware components of the MR system, such as a gradient system or a radio-frequency-transmitting unit. By contrast, the scan parameters can determine different properties of the MR scan sequence, such as the time sequence, which directly influence the contrast. For example, it is possible for a user to be able to change the values of the scan parameters via a user interface of a corresponding MR system. During scan planning, it is then possible to derive corresponding values for the system parameters based on the values of the scan parameters determined by the user.

In various examples, the first values for the different scan parameters can be adapted in the same way, such as by the same relative amounts. In various examples, it is possible for the first values for the different scan parameters to be adapted to a different degree, for example by different amounts. For example, the first values of individual scan parameters can be adapted by an amount of zero in order to obtain the corresponding second values, while the first values of other scan parameters can be adapted by an amount greater than zero in order to obtain the corresponding second values.

In various examples, the coordinate-transformed first values for the different system parameters can be adapted in the same way, for example by the same relative amounts. In other examples, the coordinate-transformed first values for the different system parameters can be adapted to a different degree, for example by different amounts. For example, the coordinate-transformed first values of individual scan parameters can be adapted by an amount of zero in order to obtain the corresponding second values, while the coordinate-transformed first values of other scan parameters can be adapted by an amount greater than zero in order to obtain the corresponding second values.

It is not necessary for all first values of the system parameters and all coordinate-transformed values of the scan parameters to be adapted by an amount greater than zero. It can be sufficient for at least one individual first value of the system parameters and at least one individual coordinate-transformed first value of the scan parameters to be adapted.

Specific scan parameters can be adapted in preference over other scan parameters. Specific scan parameters that exert a particularly great influence on the quality of the MR image can be adapted with a lower priority than other scan parameters, which are less important for the quality of the MR image.

The adaptation of the first values of the read-out bandwidth, the echo spacing and the use of the asymmetric echo can take priority over the adaptation of the first values of the echo time and the repetition time. Scan parameters of the echo time and repetition time, which are particularly critical with respect to the quality of the MR image, are only adapted with a lower priority, for example if the adaptation of the first values of the read-out bandwidth, the echo spacing and the use of the asymmetric echo still do not permit compliance with the limit values by the correspondingly adapted second values of the system parameters.

A variety of examples are possible for the implementation of the adaptation of the first values of the scan parameters and the first values of the system parameters. For example, the first values of the scan parameters can be at least partially adapted on the basis of a respective difference between the coordinate-transformed first values of the system parameters and the corresponding limit values. To this end, it is possible to take account of an analytical, prespecified dependence between that difference and the degree of the adaptation of the first values of the scan parameters. In other examples, the adaptation of the first values of the scan parameters can be performed at least partially with prespecified amounts. This means that the degree to which the limit values are exceeded by the coordinate-transformed first values of the system parameters is not taken into account, or only indirectly taken into account, during the adaptation of the first values of the scan parameters.

The prespecified amounts for the adaptation of the first values of the scan parameters can be prespecified specifically for the MR scan sequence and/or specifically for the specific scan protocol. The prespecified amounts can include a dependence on the size of the first values of the scan parameters.

It is also be possible for the prespecified amounts to be defined relatively with respect to the first values of the scan parameters. For example, the prespecified amounts can correspond to a change of not more than 30% of the respective first value of the scan parameters, preferably not more than 20%, particularly preferably not more than 10%.

Generally, it is possible for the degree of adaptation of the first values of the scan parameters in order to obtain the second values of the scan parameters to be limited. For example, the maximum degree of adaptation of the first values of the scan parameters can be prespecified. This enables the noise of the MR image to not increase to an excessive degree.

The noise of the MR image can be defined by a signal-to-noise ratio (SNR) or a contrast-to-noise ratio (CNR).

The adaptation of the first values of the scan parameters can correspond to a change of not more than 30% of the respective first value, preferably not more than 20%, particularly preferably not more than 10%. Furthermore, the adaptation of the first values of the scan parameters to correspond to an increase in the noise of the MR image of not more than 20%, preferably not more than 10%, particularly preferably not more than 5%.

The adaptation of the first values of the scan parameters and the coordinate-transformed first values of the system parameters can be performed iteratively and interleaved. This means that several iterations of the adaptation of the first values of the scan parameters and the coordinate-transformed first values of the system parameters can be performed, with the degree of adaptation of one or more values can be increased incrementally from iteration to iteration, for example. The iterative adaptation can be aborted if the checking as to whether the second values of the system parameters each comply with the corresponding limit value reveals that the current second values of the system parameters each comply with the corresponding limit value. This ensures that the first values of the scan parameters are not adapted to an excessive degree, and it can be simultaneously ensured that the second values of the system parameters each comply with the corresponding limit value. A non-excessive adaptation of the first values of the scan parameters enables an excessive reduction in the quality of the MR image or an excessive increase in the noise of the MR image to be avoided.

The above-described techniques can also be used to ensure that the first values of the system parameters are provided in the scan protocol without a large headroom with respect to the corresponding limit values. This can overall enable particularly good utilization of the limit values. For example, the first values of the system parameters can each have a spacing of not more than 20% from the corresponding limit value, preferably not more than 10%, preferably not more than 5%. Correspondingly it would be possible for the second values of the system parameters each to have a spacing of not more than 20% from the corresponding limit value, preferably not more than 10%, particularly preferably not more than 5%.

In various embodiments, an MR system in accordance with the invention has at least one processor configured to receive a scan protocol for an MR scan sequence. The scan protocol contains first values of scan parameters and first values of system parameters. The first values of the system parameters are defined in a first coordinate system. The at least one processor is further configured to determine coordinate-transformed first values of the system parameters. The coordinate-transformed first values are defined in a second coordinate system. The second coordinate system is rotated relative to the first coordinate system. The at least one processor is further configured to check whether the coordinate-transformed first values of the system parameters each comply with a corresponding limit value. The at least one processor is further configured, on the basis of the check, to adapt the first values of the scan parameters in order to obtain second values of the scan parameters. The at least one processor is further configured, on the basis of the second values of the scan parameters, to adapt the coordinate-transformed first values of the system parameters in order to obtain second values of the system parameters. The at least one processor is configured to release the scan protocol with the second values of the scan parameters and with the second values of the system parameters in order to carry out the MR scan sequence.

The invention also encompasses a non-transitory, computer-readable data storage medium encoded with programming instructions that, when the storage medium is loaded into a computer system of a magnetic resonance apparatus, caused the computer system to execute any or all of the embodiments of the method according to the invention, as described above.

The above-described features and the features described below can be used not only in the corresponding explicitly described combinations, but also in further combinations or isolation without departing from the scope of protection of the present invention.

DESCRIPTION OF THE PREFERRED EMBODIMENTS

The following describes the present invention in more detail with reference to preferred embodiments and with reference to the drawings. In the figures, the same reference numbers designate the same or similar elements. The figures are schematic representations of various embodiments of the invention. Elements shown in the figures are not necessarily shown true to scale. Instead, the different elements shown in the figures are depicted in such a way that their function and general purpose are understandable to the person skilled in the art. Connections and couplings between functional units and elements can also be implemented as indirect connections or couplings. A connection or coupling can be implemented as hard-wired or as wireless. Functional units can be implemented as hardware, software or a combination of hardware and software.

The following describes techniques that enable MR scan sequences to be performed on the basis of a scan protocol for different patient coordinate systems. In various examples, the techniques described here enable diagnostically equivalent MR images to be obtained for the different patient coordinate systems.

The different techniques described here can be performed fully automatically or semi-automatically in exemplary implementations. This means that no user interaction, or only limited user interaction, is needed to ensure that the scan protocol is compatible with the specific patient coordinate system. In particular, on the basis of the different techniques described here, it is possible to dispense with complete replanning of the scan protocol by the correlated determination of values for scan parameters and system parameters in the specific patient coordinate system. In addition, on the basis of the different techniques described here, it may not be necessary for a user to adapt different values for system parameters and/or the scan parameters in order to release a scan protocol for a specific patient coordinate system.

In different exemplary implementations, first values of scan parameters are adapted in order to obtain second values of the scan parameters; this adaptation to obtain the second values of the scan parameters in turn enables first values of system parameters to be adapted in order to obtain second values of the system parameters. In this context, the adaptation of the first values of the system parameters is performed such that the second values of the system parameters each comply with the corresponding limit value. At least some of the scan parameters for which the corresponding first values are adapted in order to obtain the second values can make it possible for, for example, such second values to be obtained for system parameters with respect to gradient pulses, which places less stringent requirements on the capacity of a gradient system. At the same time, preferably the scan parameters adapted or preferably the degree of adaptation performed do not result in any, or any significant, reduction in the quality of the MR image.

For example, the first values of the system parameters can be coordinate-transformed. The first values of the scan parameters also can be coordinate-transformed.

The techniques described herein are based on the insight that selective and slight changes to the values of scan parameters of a scan protocol make it possible to obtain values of the system parameters of the scan protocol that each fully utilize the corresponding limit values in full. The techniques described here are also based on the knowledge that this can be achieved for different rotational positions while retaining the same diagnostic image quality.

Examples of scan parameters that can be adapted according to different implementations include the read-out bandwidth and the excitation bandwidth. For example, it is possible, by increasing the read-out bandwidth by 10% to obtain an MR image with an SNR reduced by about 5%. However, the SNR reduced by 5% may not have a decisive influence on the quality of the MR image, since for example, other disruptive factors can fluctuate more greatly with respect to the corresponding contribution to the SNR. On the other hand, increasing the read-out bandwidth by 10% can cause the read-out phase of the MR scan sequence to be reduced by a corresponding amount; this enables upstream gradient pulses with lower amplitudes and/or with a lower slew rate (with a constant moment transferred to the magnetization) to be applied. In such a case, the corresponding limit values can be complied with.

Figure 1:
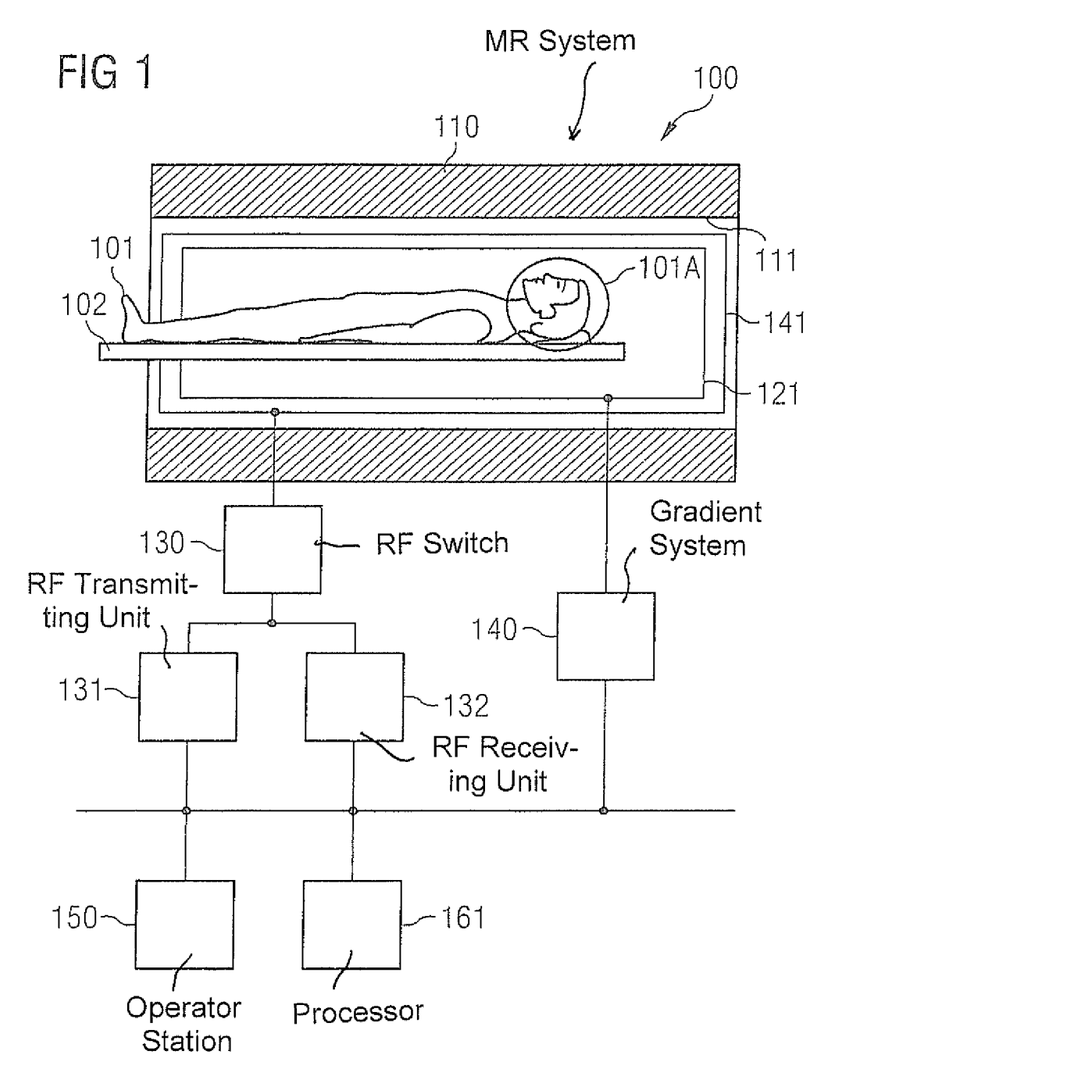
FIG. 1 is a schematic illustration of an MR system configured to perform the techniques described herein for the adaptation of a scan protocol.

FIG. 1 is a schematic illustration of an MR system 100, which can be used to carry out the above-described techniques and the techniques described below. The MR system 100 has a scanner with a magnet 110 that defines a tube 111. The magnet 110 generates a basic magnetic field parallel to its longitudinal axis. The basic magnetic field can have inhomogeneities, i.e. local deviations from a reference value. The basic magnetic field can also have a drift, i.e. deviations from a reference value that vary as a function of time.

An object under examination, here a person to be examined 101, can be moved into the magnet 110 on an examination table 102. In the example in FIG. 1, a region of interest 101A is arranged in the region of the head of the person to be examined 101.

The MR system 100 further has a gradient system 140 for generating gradient fields, which are used for MR imaging and spatial encoding of acquired MR data. Typically, the gradient system 140 has at least three separately controllable gradient coils 141, which are in clearly defined positions with respect to one another. The gradient coils 141 make it possible to apply gradient pulses along specific spatial directions (gradient axes), which generate the gradient fields. These gradient axes define a machine coordinate system. The gradient fields can be used for slice selection, for frequency encoding (in the read-out direction) and for phase-encoding. This enables spatial encoding of the MR data to be achieved. The maximum rate of change and the maximum amplitude of gradient pulses for each gradient coil 141 are typically limited by corresponding limit values.

To excite the polarization resulting in the basic magnetic field or to align the nuclear magnetization in the longitudinal direction, an RF coil arrangement 121 is provided that radiates an amplitude-modulated and/or frequency-modulated RF excitation pulse into the person to be examined 101. This enables transverse magnetization to be generated. The flip angle of the RF excitation pulse defines the degree of deflection. The flip angle of the RF excitation pulse is correlated with the amplitude or transmit power of the RF excitation pulse. The transmit power of the RF excitation pulse is typically limited by a corresponding limit value. The limit value can be determined by technical limits and/or physiological limits, for example the SAR. To generate RF excitation pulses of this kind, an RF-transmitting unit 131 is connected to the RF coil arrangement 121 via an RF switch 130. The RF-transmitting unit 131 can include an RF generator and an RF amplitude modulation unit. The RF excitation pulses can tip the transverse magnetization 1D slice-selectively or 2D/3D locally-selectively or globally out of its rest position.

In addition, an RF receiving unit 132 is connected to the RF coil arrangement 121 by the RF switch 130. The RF receiving unit 132 can be used to acquire or measure MR signals of the relaxing transverse magnetization as MR data, for example by inductive coupling into the RF coil arrangement 121.

It is generally possible to use separate RF coil arrangements 121 for the radiation of the RF excitation pulses by the RF-transmitting unit 131 and for the acquisition of the MR data by the RF receiving unit 132. For example, a volume coil 121 can be used to radiate RF pulses and a surface coil (not shown) for the acquisition of raw data consisting of an array of RF coils. For example, the surface coil for the acquisition of the raw data can be composed of thirty two individual RF coils and hence be particularly suitable for PPA techniques. Corresponding techniques are known to those skilled in the art so that there is no need for an explanation of further details herein.

The MR system 100 further has an operator station 150, which can include a screen, a keyboard, a mouse, etc. The operator station 150 can be used to acquire user inputs and provide output for the user. For example, the operator station 150 can be used to set individual operating modes or operating parameters for the MR system 100 by the user and/or automatically and/or remotely.

The MR system 100 further has a processor 161. The processor 161 is configured to perform different techniques described herein. For example, the processor 161 can be configured to receive a scan protocol. For example, the processor 161 can receive the scan protocol from a memory, such as a volatile or non-volatile memory (the memory is not shown in FIG. 1). The processor 161 is further configured in order to perform a coordinate transformation for the determination of coordinate-transformed first values of system parameters of the scan protocol. For example, the coordinate transformation can transform the first values of the system parameters of the scan protocol from a first coordinate system into a second coordinate system, such as the patient coordinate system. The processor 161 is further configured in order to check whether the coordinate-transformed first values of the system parameters each comply with a corresponding limit value, for example a technical and/or physiological limit value. To this end, the processor 161 can perform a threshold value comparison between the respective limit value and the corresponding coordinate-transformed first value. The processor 161 is further configured to adapt the coordinate-transformed first values and first values of scan parameters of the scan protocol if, for example, the check reveals that the coordinate-transformed first values do not comply with the limit values. The processor 161 is also configured to release the scan protocol with the adapted second values of the scan parameters and with the adapted second values of the system parameters in order to carry out the MR scan sequence. For example, the processor 161 also can implement a sequence control function with respect to the MR scan sequence.

Figure 2:
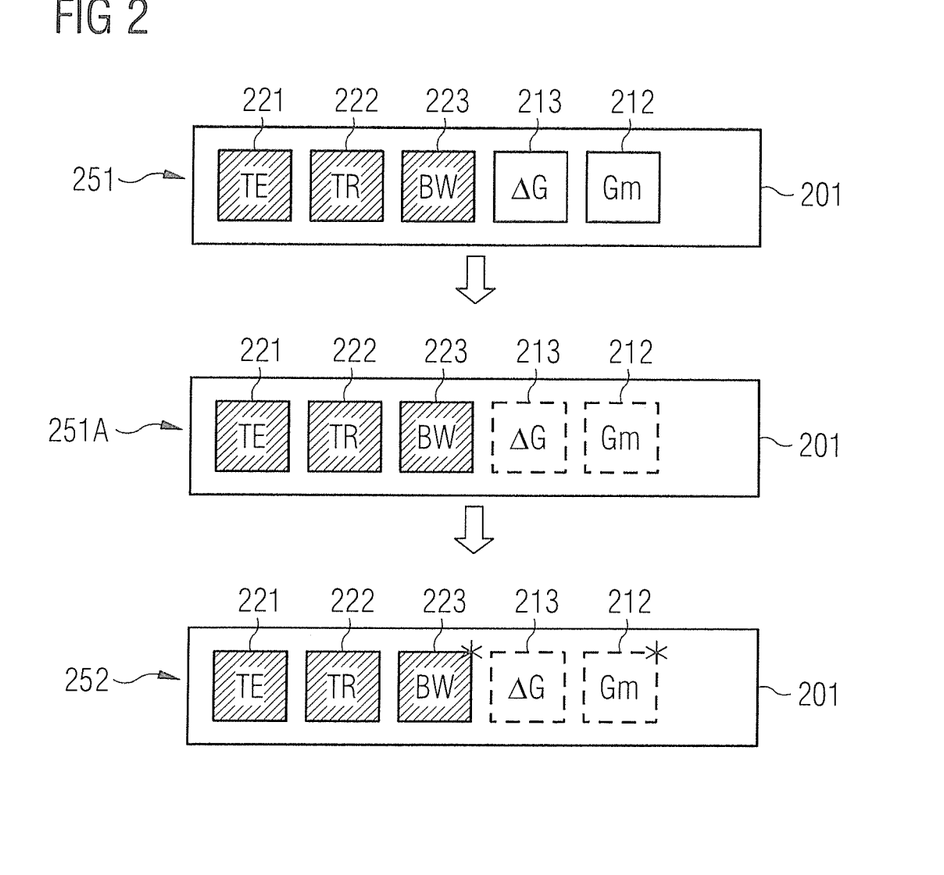
FIG. 2 is a schematic illustration of the adaptation of first values of scan parameters and the adaptation of coordinate-transformed first values of system parameters according to various embodiments.

FIG. 2 illustrates aspects relating to the adaptation of first values 251,251A of scan parameters 221-223 of the scan protocol 201 and of first values 251,251A of system parameters 212,213 of the scan protocol 201. The top of FIG. 2 shows the first values 251 of the original scan protocol 201 such as is received for example from a memory. First values 251 are defined for the following scan parameters: the echo time 221; the repetition time 222; and the read-out bandwidth 223. First values 251 are defined for the following system parameters: the maximum amplitude 212 of gradient pulses; and the maximum slew rate 213 of gradient pulses.

FIG. 2 shows an individual first value 251 for the amplitude 213; however, it would be possible for first values 251 to be defined for each of a number of gradient pulses.

The system parameters 212,213 and scan parameters 221-223 shown in FIG. 2 are examples. In other examples, it is possible to use more, fewer or other scan parameters and/or system parameters. Further examples of scan parameters include the use of an asymmetric echo and the echo spacing. Further examples of system parameters include the transmit power of radio-frequency pulses.

The echo time 221 can designate the time between the center of an excitation radio-frequency pulse and the reading out of MR data for the center of k-space.

The repetition time 292 can designate the time between the successive excitation of the magnetization in the same slices of the region of interest 101A.

The read-out bandwidth 223 can designate the frequency bandwidth for each data sample; in this context, a larger (smaller) read-out bandwidth 223 can designate a shorter (longer) time for the acquisition of MR data for each data sample.

The use of an asymmetric echo can designate the partial sampling of k-space in the phase-encoding direction. For example, it is possible for only half k-space to be sampled in the phase-encoding direction.

The echo spacing can designate a time between the irradiation of successive radio-frequency refocusing pulses.

Following the reception of the first values 251, a coordinate transformation is performed. This is used to determine coordinate-transformed first values 251A. In the example in FIG. 2, the coordinate transformation influences the first values 251 of the system parameters 212,213; in other examples it would also be possible for only a subset of the system parameters to be dependent upon the coordinate system. In other examples, the first values 251 of at least individual scan parameters could also be influenced by the coordinate transformation. In the example in FIG. 2, the scan parameters 221-223 are invariant relative to the rotation of the coordinate system. In other examples, the scan parameters 201 20-223 can be at least partially dependent on the coordinate system; it would then be possible for corresponding coordinate-transformed first values 251A also to be determined for the corresponding system parameters.

The coordinate-transformed first values 251A are defined in the patient coordinate system. In other embodiments, the coordinate-transformed first values 251A could also be defined in other coordinate systems.

Following this, the first values 251,251A of the scan parameters 221-223 and the first values 251,251A of the system parameters 212,213 are adapted in order to obtain second values 252 of the scan parameters 221-223 and second values 252 of the system parameters 212,213. In the example in FIG. 2, the read-out bandwidth 223 is enlarged so that a lower amplitude 212 of the gradient pulses can be achieved (depicted by an asterisk in FIG. 2).

Figure 3:
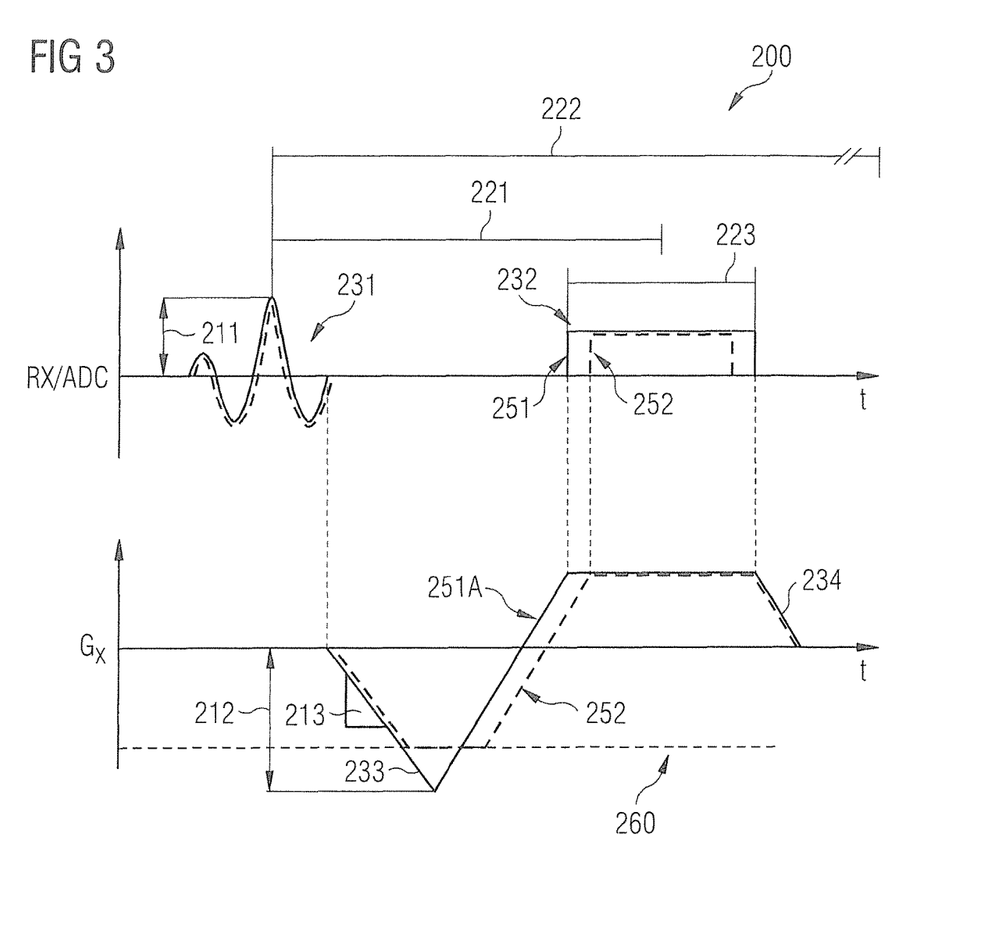
FIG. 3 is a schematic illustration of an MR scan sequence performed on the basis of second values of scan parameters and system parameters of a scan protocol.

This is also shown in FIG. 3. FIG. 3 is a sequence diagram of an exemplary scan sequence 200. FIG. 3 in particular illustrates aspects relating to the adaptation of first values 251,251A of the scan parameters 221-223 and first values 251,251A of the system parameters 211-213.

The sequence diagram in FIG. 3 illustrates a gradient-echo MR scan sequence 200, as an example. First, a radio-frequency excitation pulse 231 with a specific amplitude/transmit power 211 is irradiated as a further system parameter. Then, a defocusing gradient pulse 233 and a refocusing gradient pulse 234 are switched or applied to form a gradient echo of the magnetization, which was excited by the radio-frequency excitation pulse 231. FIG. 3 further illustrates the slew rate 213 and the amplitude 212 for the gradient pulse 233. The acquisition of MR data takes place during a read-out phase 232 with a specific read-out bandwidth 223 (which is only illustrated schematically in FIG. 3).

In FIG. 3, the continuous line illustrates the MR scan sequence 200 using the scan protocol 201 with the first values 251,251A of the system parameters 211-213 and the scan parameters 221-223. In FIG. 3, the dashed line illustrates the MR scan sequence 200 using the scan protocol 201 with the second values 252 of the system parameters 211-213 and the scan parameters 221-223.

It is evident from FIG. 3 that the first value 251,251A of the amplitude 212 of the gradient pulse 223 does not comply with a technical limit value 260. However, it is not directly possible to reduce the amplitude 212: for example, it is evident from FIG. 3 that the time between the irradiation of the radio-frequency excitation pulse 231 and the acquisition of MR data is limited due to the echo time 221, the repetition time 222 and the read-out bandwidth 223. In particular, on the one hand, the amplitude 212 and the slew rate 213 of the gradient pulse 233 and, on the other, the echo time 221, the repetition time 222 and the read-out bandwidth 223 are mutually limiting.

The adaptation of the read-out bandwidth 223 results in a shortening of the read-out phase 232. This in turn makes it possible to select the amplitude 212 of the gradient pulse 223 lower with respect to the second values 252 (illustrated by the dashed line). The moment transmitted does not change as a result of the reduction in the amplitude 212 due to the prolonged duration of the gradient pulse 233.

For example, the quantity of the scan parameters to be adapted can be selected on the basis of the MR scan sequence to be performed. It would also be possible for the degree of adaptation of the first values 251,251A of the scan parameters to be selected on the basis of the MR scan sequence to be performed. For example, in connection with an EPI MR scan sequence, preference could be given to the adaptation of the use of an asymmetric echo. For example, in connection with a TSE or spin echo MR scan sequence, preference could be given to the adaptation of the echo spacing, the echo time and/or the repetition time.

In principle it is desirable to limit the degree of adaptation of the first values 251,251A of the scan parameters. It is possible for the adaptation of the first values 251,251A of the scan parameters 221-223 to correspond to a change of not more than 30% of the respective first value 251,251A, preferably not more than 20%, particularly preferably not more than 10%. This enables significant deterioration of the SNR and/or CNR of the MR image to be avoided.

For example, the change of the first value 251,251A of the scan parameters 221-223 can be limited with respect to the change of the SNR and/or CNR of the MR image. For example, it is possible for the adaptation of the first values 251,251A of the scan parameters 221-223 to correspond to an increase in the noise, i.e. for example SNR and/or CNR, of the MR image of not more than 20%, preferably not more than 10%, particularly preferably not more than 5%.

In principle, it can be desirable to give preference to the adaptation of the first values 251,251A of those scan parameters which have relatively little influence on the noise of the MR image to be generated. For example, preference can be given to the adaptation of the first values 251,251A of the read-out bandwidth, of the echo spacing and the use of the asymmetric echo. For example, it would be possible only to adapt the first values 251,251A of the echo time and the repetition time in cases when, following the adaptation of the first values of the read-out bandwidth, of the echo spacing and the use of the asymmetric echo, the corresponding second values of the system parameters do not comply with the respective limit values.

In principle, the first values 251,251A of different scan parameters can be adapted to different degrees. In principle, the first values 251,251A of different system parameters can be adapted to different degrees.

It is evident from the above, that the scan parameters 221,222,223 can in particular define a time sequence of the MR scan sequence. In addition, the system parameters 211-213 can define properties of gradient pulses or radio-frequency pulses of the MR scan sequence.

Figure 4:
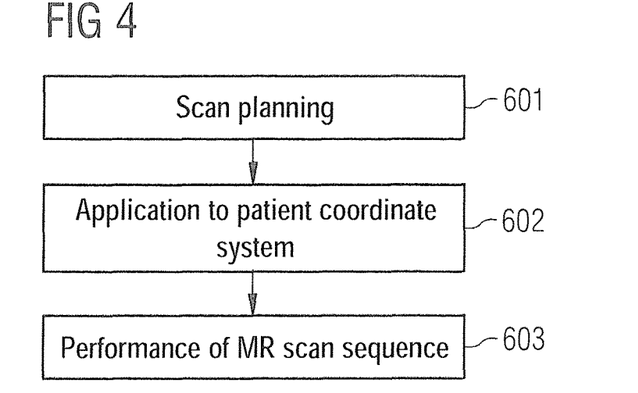
FIG. 4 is a flowchart of an embodiment of the method according to the invention.

FIG. 4 is a flowchart of a method according to various embodiments. First, the planning of the first values 251, 251A of the parameters of a scan protocol is performed in step 601. Step 601 is also designated scan planning. For example, the scan protocol can be planned for a first patient or independently of a specific patient.

For example, it would be possible for the first values 251,251A of the parameters of the scan protocol 201 to be planned in step 601 such that they are defined in a machine coordinate system of the corresponding MR system 100, i.e. such that logical and physical axes are the same or orthogonal. At the same time, in various examples it can be possible for the first values 251,251A of the parameters of the scan protocol 201 to be planned in step 601 such that the respective limit values are utilized as well as possible and without much headroom. To this end, it is possible to use techniques such as those described in patent application DE 10 2016 200549.9. For example, it is possible for the first values 251 of the system parameters 211-213 each to have a spacing of not more than 20% to the corresponding limit value, preferably not more than 10%, particularly preferably not more than 5%.

It is then possible for the first values 251 of the parameters of the scan protocol 201 to be written to a memory. For example, the scan protocol 201 can be filed in a database structure of the memory.

Then, in step 602 the previously planned scan protocol 201 is applied to a specific patient. In step 602, the coordinate-transformed first values 251A of the system parameters 211-213 and/or of the scan parameters 221-223 are determined so as to be defined in the respective patient coordinate system. In step 602, the slices in the imaging are identified that have to be tilted so that the patient coordinate system is rotated relative to the machine coordinate system with respect to which the non-coordinate-transformed first values 251 of the system parameters of the scan protocol 201 are defined. This means that the logical and physical gradient axes no longer coincide.

Then, the MR scan sequence is performed, step 603. In this context the possibly coordinate-transformed first values 251,251A of the scan parameters 221-223 and the possibly coordinate-transformed first values 251,251A of the system parameters 211-213 are used as long as these both comply with the corresponding limit values. Otherwise, different techniques described herein are applied in order to obtain adapted second values 252 for the scan parameters 221-223 and the system parameters 211-213 (not shown in FIG. 4). The scan sequence in step 603 is performed with the second values 252.

Figure 5:
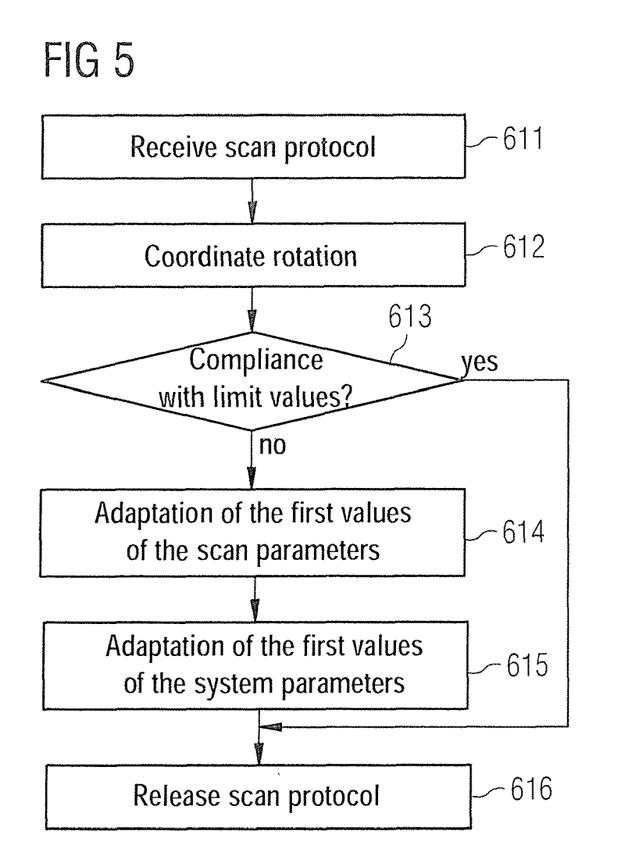
FIG. 5 is a flowchart of another embodiment of the method according to the invention.

FIG. 5 is a flowchart of a method according to various embodiments. FIG. 5 illustrates aspects relating to the adaptation of the first values 251,251A of the parameters 211-213, 221-223 of the scan protocol 201. For example the different techniques are performed according to the method from FIG. 5 in step 602. This can take place automatically; it is not necessary for the user to be informed of the corresponding steps. The performance of the MR scan sequence in step 603 thus can start automatically after the conclusion of the method according to the example in FIG. 5 without further input from the user.

In step 611, the scan protocol 201 is received. For example, in step 611 a scan protocol 201 which was previously planned during the scan planning can be read from a memory.

In step 612, coordinate-transformed first values 251A of the system parameters 211-213 and/or of the scan parameters 221-223, which are defined in the patient coordinate system, are determined. In step 612, typically a coordinate rotation of the first values 251 is performed in order to obtain the coordinate-transformed first values 251A.

Then, in step 613 a check is performed as to whether the coordinate-transformed first values 251A of the system parameters 211-213 each comply with a corresponding limit value 260. If this the case, the scan protocol is released in step 616 so that the MR scan sequence can then be performed in step 603 on the basis of the first values 251,251A.

However, if at least one first value 251,251A of the system parameters 211-213 does not comply with the corresponding limit value, in step 614, the possibly coordinate-transformed first values 251,251A of the scan parameters 221-223 are adapted in order to obtain second values 252 of the scan parameters 221-223. In this context, in step 614, the first values 251,251A of the scan parameters 221-223 can be adapted such that at least one second value 252 of the scan parameters 221-223 deviates from the corresponding at least one first value 251,251A of the scan parameters 221-223.

In step 615, the possibly coordinate-transformed first values 251,251A of the system parameters 211-213, such as those from step 612, are adapted. In particular, first values 251,251A step 615 are adapted on the basis of the second values 252 of the scan parameters 221-223 from step 614.

Then, the scan protocol is released in step 616 on the basis of the second values 252 of the scan parameters 221-223 and the second values 252 of the system parameters 211-213. The MR scan sequence is then performed, in step 603.

Optionally, another check can be performed before the performance of step 616 as to whether the second values 252 of the system parameters 211-213 each comply with the corresponding limit value 216. It is optionally possible for the release of the scan protocol in step 616 to take place if the check reveals that the second values 252 of the system parameters 211-213 each comply with the corresponding limit value 216. Correlated replanning of the values of all the parameters of the scan protocol 201 for the patient coordinate system can be performed if the check reveals that the second values 252 of the system parameters 211-213 do not comply with the limit values 260. This means that repeat scan planning (see step 601) can be performed in cases in which no valid scan protocol can be obtained by the adaptation of the first values 251,251A of the original scan protocol 201. In a further example, the user can be prompted to make a manual change from the first values 251,251A of the scan parameters and/or the system parameters if the check reveals that the second values 252 of the system parameters 211-213 do not comply with the limit values 260. In such cases, the user can be provided with suggestions, which can be derived from the previously determined information with respect to the adaptation of the first values 251,251A. For example, manually performed changes could have a relatively strong influence on the noise in the MR image. For example, in this connection, the slice number or the resolution of the MR image could be changed.

Different approaches for the adaptation of the first values 251,251A of the scan parameters 221-223 and the system parameters 211-213 are possible. For example, the adaptation can be performed iteratively, for example by the read-out bandwidth 223 being increased in increments starting from the corresponding first value 251, until either a permitted maximum change of the read-out bandwidth (for example limited to a relative change of 10%) is achieved or a valid scan protocol 201 is obtained, i.e. a scan protocol with which the correspondingly interleaved adapted second values 252 of all system parameters 211-213 comply with the respective limit values 260.

Figure 6:
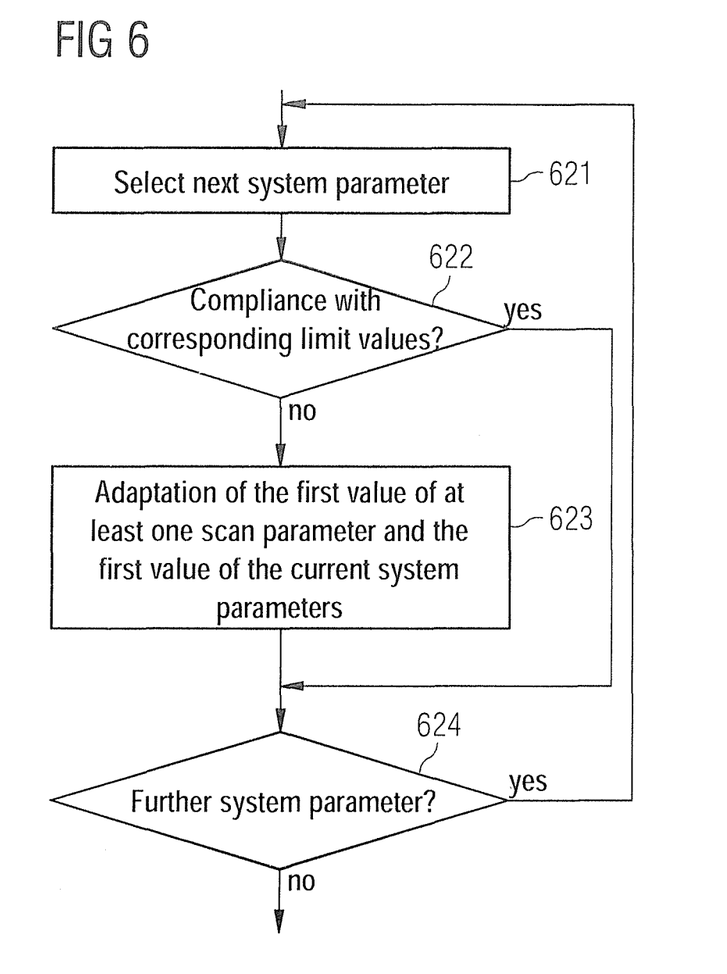
FIG. 6 is a flowchart of another embodiment of the method according to the invention that illustrates the adaptation of values of scan parameters and system parameters.

FIG. 6 is a flowchart of a method according to various embodiments. FIG. 6 illustrates aspects relating to the adaptation of first values 251,251A of the scan parameters 221-223 and the first values 251,251A of the system parameters 211-213.

First, in step 621 a current system parameter 211-213 is selected. In step 612, a check is performed as to whether the possibly coordinate-transformed first value 251,251A of the respective current system parameter 211-213 complies with the corresponding limit value 260. If this is the case, a check is performed in step 624 as to whether a further system parameter 211-213 has to be checked.

If the check in step 612 reveals that the first value 251,251A of the current system parameter 211-213 does not comply with the corresponding limit value 260, in step 623 the first value 251,251A of at least one scan parameter 221-223 is adapted; in addition, in step 623, the coordinate-transformed first value 251A of the current system parameter 211-213 is adapted on the basis of the adapted first value 251,251A of the at least one scan parameter 221-223.

In step 624, a check is then performed as to whether a further system parameter should be checked. If this is the case, steps 621-623 are repeated.

Figure 7:
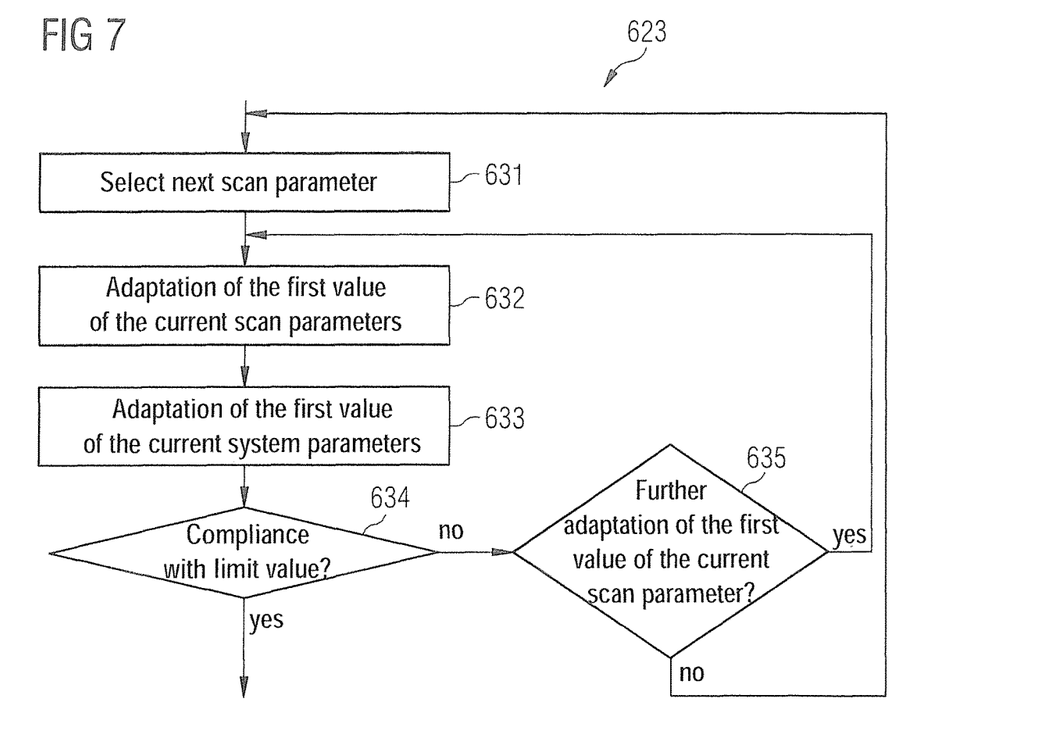
FIG. 7 is a flowchart of another embodiment of the method according to the invention that illustrates further aspects of the adaptation of values of scan parameters and system parameters.

FIG. 7 is a flowchart of a method according to various embodiments. FIG. 7 illustrates aspects relating to the adaptation of the first value 251,251A of at least one scan parameter 221-223 and the first value 251,251A of a system parameter 211-213. For example, the method according to FIG. 7 can be carried out on step 623.

FIG. 7 illustrates the interleaved and iterative performance of the adaptation of the first values 251,251A of the scan parameters 221-223 and the system parameters 211-213 and the check as to whether the respective limit value 216 is complied with.

Figure 8:
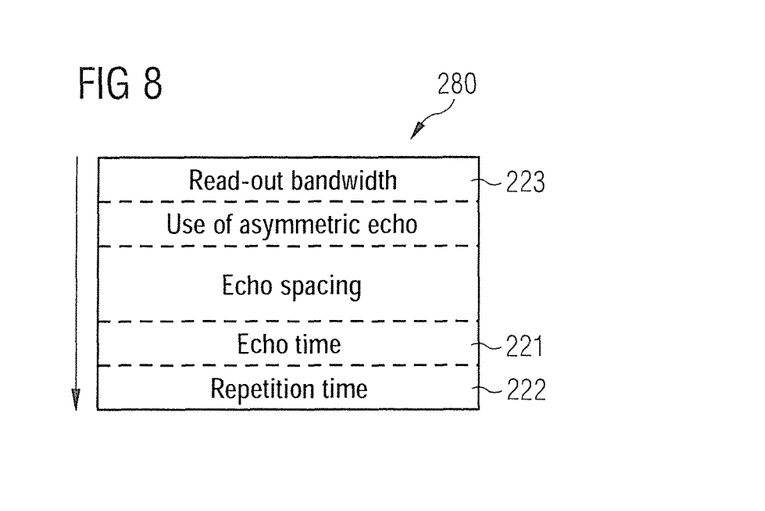
FIG. 8 illustrates different scan parameters, wherein the adaptation of individual scan parameters is given preference over other scan parameters.

First, in step 631, a current system parameter 221-223 is selected. In this context, during the repetition of step 631, a specific sequence can be implemented with which different scan parameters 221-223 are selected. An appropriate sequence 280 is shown in FIG. 8 as an example. It can be seen from FIG. 8 that the read-out bandwidth is adapted first, and only after this the echo time 221 and the repetition time 222 are adapted.

Returning to FIG. 7, the first value 251,251A of the current scan parameter 221-223 then is adapted. For example, the adaptation in step 632 can entail a prespecified amount.

Then, in step 633, the first value 251,251A of the current system parameter 211-213 is adapted on the basis of the second value 252 of the current scan parameter from step 632.

In step 634, a check is performed as to whether the second value 252 of the current system parameter 211-213 obtained from step 633 complies with the corresponding limit value 260. If this is not the case, a check is performed in step 635 as to whether a further adaptation of the current scan parameter is possible. For example, in step 635, a comparison can be made as to how large the previous total adaptation of the current scan parameter 221-223 was relative to a prespecified threshold value. In step 635, the degree to which the previous total adaptation of the current scan parameter reduced the quality of the MR image to be obtained, or intensified the noise in the MR image, can be taken into account.

If the check in step 635 reveals that a further adaptation of the first value 251,251A of the current scan parameter 221-223 is possible, steps 632-634 are repeated. Otherwise, the current second value 252 of the current system parameter 211-213 from the last iteration of step 633 is adopted and, in step 631, the next scan parameter 221-223 is selected, such as from the list 280 (see FIG. 8). Then, steps 632-635 are repeated so that finally the second value 252 of the current system parameter 211-213 complies with the corresponding limit value 260.

In summary: the above-described techniques make it possible also to select the values for system parameters such that specific limit values are utilized as efficiently as possible. At the same time, scan protocols are used that define starting values for the system parameters that are already close to the corresponding limit value.

In order to ensure that a valid scan protocol is obtained despite the transfer of the scan protocol into a patient coordinate system, starting values of scan parameters of the scan protocol can be adapted selectively. In this context, the starting values can be adapted for scan parameters of the scan protocol which enables a conservative choice of the values of the system parameters with respect to the corresponding limit values.

The above-described techniques enable the values for system parameters to be selected such that specific limit values are utilized as efficiently as possible and without the quality of an MR image being significantly reduced. In particular, an additional contribution to the noise due to the adaptation of specific scan parameters can be relatively low. Correspondingly, it is possible for the values of scan parameters to be adapted in a prespecified sequence selected with respect to the additional contribution to the noise.

The techniques described here can be performed fully automatically or at least semi-automatically. User interaction is triggered only in cases in which the adaptation of the starting values of the scan parameters does not result in any values for the system parameters to be found that each comply with the corresponding limit values. The user interaction can entail the manual modification of specific parameters of the scan protocol. It is also possible for correlated replanning of all the values to be performed.

With the techniques described herein, more efficient utilization of technical limit values and/or physiological limit values is achieved. This enables improved MR imaging capacity to be achieved. In predefined scan protocols, there is no need to provide a particularly large amount of headroom with respect to the system parameters, such as, for example, amplitudes of gradient pulses.

The techniques described here nevertheless enable the different scan protocols to be adapted flexibly to a variety of patient coordinate systems. In this context, the adaptation of the scan protocols can be performed at least semi-automatically or fully automatically; this reduces the complexity of operation. At the same time, errors are avoided. It is also possible to ensure high quality of the MR images obtained in this way. It is not necessary, to provide especially qualified operators for the adaptation of the corresponding scan protocols.

The features of the above-described embodiments and aspects of the invention can be combined with one another. In particular, the features can be used not only in the described combinations, but also in other combinations or individually without departing from the scope of the invention.

For example, the techniques described herein can be combined with further techniques in order to optimize the values of the system parameters. One example of a technique of this type is described in DE 10 2013 202559 B3. The content of DE 10 2013 202559 B3 is incorporated herein by reference.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for computerized adaption of a magnetic resonance (MR) scan protocol, said method comprising:
providing a scan protocol to a computer for an MR scan sequence to be executed by an MR system, said scan protocol comprising first values of scan parameters and first values of system parameters of said MR system, defined in a first coordinate system;
in said computer, determining coordinate-transformed first values of the system parameters that are defined in a second coordinate system that is rotated relative to the first coordinate system;
in said computer, checking whether the coordinate-transformed first values of the system parameters each comply with a respective limit value, thereby obtaining a check outcome;
when said check outcome indicates that the coordinate-transformed first values of the system parameters each comply with the respective limit value, adapting, in said computer, the first values of the scan parameters to obtain second values of the scan parameters;
in said computer, using said second values of said scan parameters to adapt the coordinate-transformed first values of the system parameters, to obtain second values of the system parameters; and
in said computer, generating control signals corresponding to an adapted scan protocol, comprising said second values of said scan parameters and said second values of said system parameters, for execution by said MR system, and emitting said control signals corresponding to adapted scan protocol from said computer to said MR system, and thereby operating the MR system so as to acquire MR data from a subject, and making the acquired MR data available from the computer as a data file.

2. A method as claimed in claim 1 comprising generating said adapted scan protocol wherein said second values of said scan parameters and said second values of said system parameters are mutually limiting.

3. A method as claimed in claim 1 comprising providing said computer with said scan protocol wherein said system parameters define properties of at least one of gradient pulses or radio-frequency pulses of said MR scan sequence.

4. A method as claimed in claim 1 wherein said system parameters are selected from the group consisting of slew rate of gradient pulses, amplitude of gradient pulses, and transmit power of radio-frequency pulses.

5. A method as claimed in claim 1 wherein said scan parameters define a time sequence of said MR scan sequence.

6. A method as claimed in claim 1 wherein said scan parameters are selected from the group consisting of echo time, repetition time, use of an asymmetric echo, echo spacing, and read-out bandwidth.

7. A method as claimed in claim 6 comprising adapting the first values of the read-out bandwidth, the echo spacing and the use of asymmetric echo with priority over adaptation of the first values of the echo time and the repetition time.

8. A method as claimed in claim 1 comprising adapting said first values of said scan parameters by predetermined amounts.

9. A method as claimed in claim 1 comprising limiting adaptation of said first values of said scan parameters to a change of not more than 30% of each of said first values.

10. A method as claimed in claim 1 comprising limiting adaptation of said first values of said scan parameters to respective values that do not increase noise during operation of said MR system by more than 20%.

11. A method as claimed in claim 1 comprising limiting adaptation of said first values of said scan parameters to respective limit values so that each of said first values is under the respective limit value by not more than 20%.

12. A method as claimed in claim 1 comprising, in said computer, executing a further check as to whether said second values of the system parameters each comply with a respective limit value, and releasing said adapted scan protocol only if a result of said further check is that the second values of the system parameters each comply with said respective limit value.

13. A method as claimed in claim 12 comprising adapting said first values of said scan parameters and the coordinate-transformed first values of the system parameters iteratively and interleaved with said further checking.

14. A method as claimed in claim 12 comprising if the result of said further check is that at least one of said second values of said system parameters does not comply with the respective limit value, implementing a replanning in said computer of values of all of said parameters of said scan protocol for said second coordinate system.

15. A method as claimed in claim 1 wherein said respective limit values are at least one of technical limit values or physiological limit values.

16. A method as claimed in claim 1 wherein said scan parameters are invariant relative to rotation of said coordinate system.

17. A method as claimed in claim 1 wherein said first coordinate system is a machine coordinate system and said second coordinate system is a patient coordinate system.

18. A method as claimed in claim 1 comprising executing said adapted scan protocol with said MR system.

19. A magnetic resonance (MR) apparatus comprising:
an MR data acquisition scanner;
a computer provided with a scan protocol for an MR scan sequence to be executed by said MR data acquisition scanner, said scan protocol comprising first values of scan parameters and first values of system parameters of said MR data acquisition scanner, defined in a first coordinate system;
said computer being configured to determine coordinate-transformed first values of the system parameters that are defined in a second coordinate system that is rotated relative to the first coordinate system;
said computer being configured to check whether the coordinate-transformed first values of the system parameters each comply with a respective limit value, thereby obtaining a check outcome;
when said check outcome indicates that the coordinate-transformed first values of the system parameters each comply with the respective limit value, said computer being configured to adapt the first values of the scan parameters to obtain second values of the scan parameters;
said computer being configured to use said second values of said scan parameters to adapt the coordinate-transformed first values of the system parameters, to obtain second values of the system parameters; and
said computer being configured to release an adapted scan protocol, comprising said second values of said scan parameters and said second values of said system parameters, for execution by said MR data acquisition scanner, by emitting said adapted scan protocol as an electronic signal from said computer with a format executable by said MR data acquisition scanner.

20. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
receive a scan protocol to a computer for an MR scan sequence to be executed by said MR data acquisition scanner, said scan protocol comprising first values of scan parameters and first values of system parameters of said MR data acquisition scanner, defined in a first coordinate system;
determine coordinate-transformed first values of the system parameters that are defined in a second coordinate system that is rotated relative to the first coordinate system;
check whether the coordinate-transformed first values of the system parameters each comply with a respective limit value, thereby obtaining a check outcome;
when said check outcome indicates that the coordinate-transformed first values of the system parameters each comply with the respective limit value, adapt the first values of the scan parameters to obtain second values of the scan parameters;
use said second values of said scan parameters to adapt the coordinate-transformed first values of the system parameters, to obtain second values of the system parameters; and
generate control signals corresponding to an adapted scan protocol, comprising said second values of said scan parameters and said second values of said system parameters, for execution by said MR data acquisition scanner, and emitting control signals corresponding to said adapted scan protocol from said computer with a format executable to said MR data acquisition scanner, and thereby operate the MR system so as to acquire MR data from a subject, and make the acquired MR data available from the computer as a data file.

21. A non-transitory, computer-readable data storage medium as claimed in claim 20, wherein said programming instructions further cause said computer to:
reconstruct image data of the subject from the acquired MR data in said data file, and make the reconstructed image data available from the computer in electronic form as an image data file.

22. A method as claimed in claim 1 comprising:
in said computer, reconstructing image data of the subject from the acquired MR data in said data file, and making the reconstructed image data available from the computer in electronic form as an image data file.

* * * * *